United States Patent [19]

Alfaro

[11] 4,159,507

[45] Jun. 26, 1979

[54] STRIPLINE CIRCUIT REQUIRING HIGH DIELECTRICAL CONSTANT/HIGH G-FORCE RESISTANCE

[75] Inventor: Vincent R. Alfaro, Mesa, Ariz.

[73] Assignee: Motorola, Inc., Schaumburg, Ill.

[21] Appl. No.: 848,627

[22] Filed: Nov. 4, 1977

[51] Int. Cl.² ............................................. H05K 1/04
[52] U.S. Cl. ........................................ 361/401; 29/626; 333/238; 361/414
[58] Field of Search ...................... 361/414, 402, 401; 333/84 M; 174/52 FP; 219/121 LM; 29/625, 626

[56] References Cited

U.S. PATENT DOCUMENTS

| | | | |
|---|---|---|---|
| 3,218,584 | 11/1965 | Ayer | 333/84 M |
| 3,659,205 | 4/1972 | Cooke et al. | 361/401 |
| 3,739,232 | 6/1973 | Grossman et al. | 361/401 |
| 3,768,157 | 10/1973 | Buie | 219/121 LM |
| 3,792,383 | 2/1974 | Knappenberger | 361/414 |
| 3,828,228 | 8/1974 | Wong et al. | 174/52 FP |
| 3,947,934 | 4/1976 | Olson | 361/402 |

*Primary Examiner*—David Smith, Jr.
*Attorney, Agent, or Firm*—Eugene A. Parsons

[57] ABSTRACT

A stripline circuit formed of a first flat member made of ceramic and a second member made of ceramic or a flexible material having the same dielectric constant as ceramic, laminated to the first member with circuit components therebetween and layers of copper on the outer surfaces thereof to form ground planes so that the ceramic adds rigidity to the package as well as high heat resistance and the components may be welded thereto and laser trimmed.

12 Claims, 1 Drawing Figure

U.S. Patent
Jun. 26, 1979
4,159,507
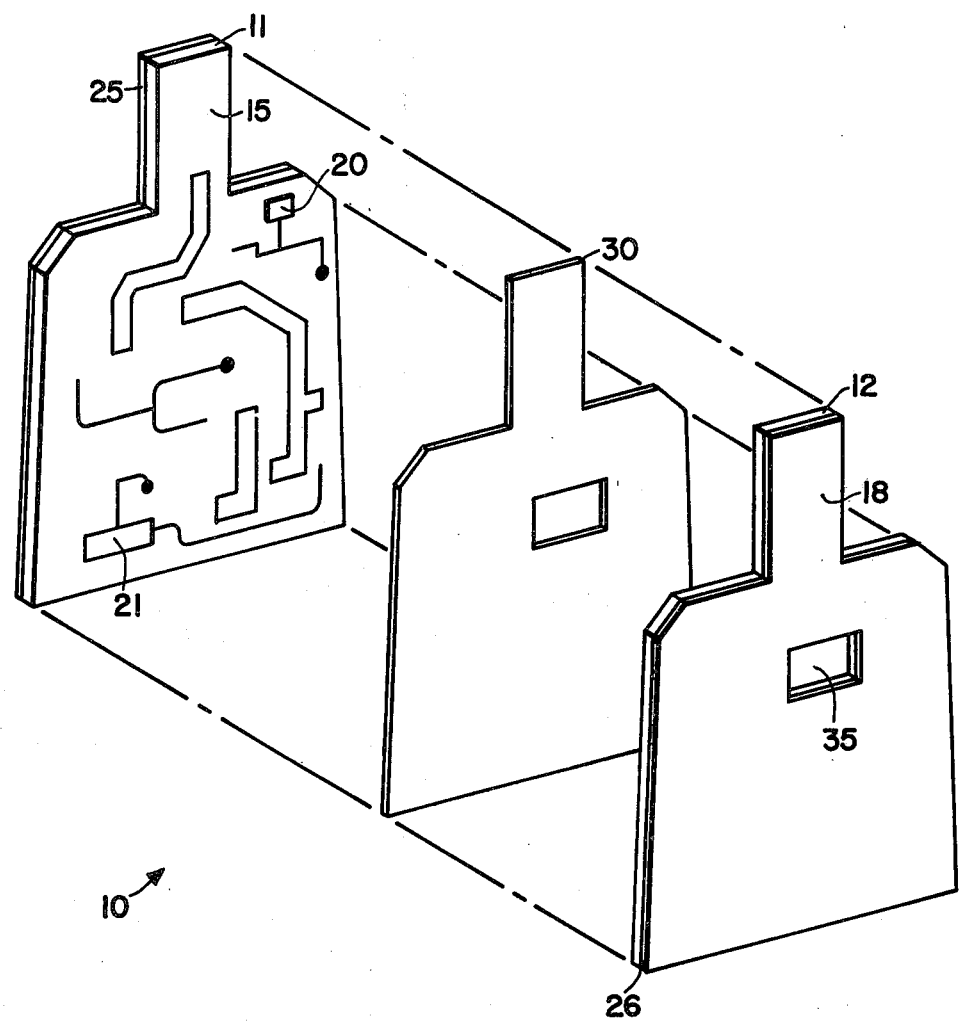

STRIPLINE CIRCUIT REQUIRING HIGH DIELECTRICAL CONSTANT/HIGH G-FORCE RESISTANCE

BACKGROUND OF THE INVENTION

In the prior art, two relatively compliant mating members are formed from some material, such as a ceramic impregnated teflon, or the like. Circuit components are affixed to the inner surface of one of the members and the outer surfaces of both members are covered with a layer of copper. The ceramic material impregnated in the teflon provides the high dielectric constant which is required for relatively high frequency circuits, but it is relatively difficult to bond circuit components and copper layers onto the teflon and to laminate the teflon members together. Further, because the teflon will not withstand high temperatures, it is impossible to perform many techniques, such as welding and depositing, that would be extremely advantageous in affixing components to the members. Components, such as microwave integrated circuits are extremely difficult to affix to the members and have a tendency to break loose during high G operation. Also, because of the compliance of both members, there is a tendency for the members to deform slightly under high G operation, which seriously affects operation of the stipline circuit.

SUMMARY OF THE INVENTION

The present invention pertains to a stripline circuit requiring a relatively high dielectric constant material and a high G acceleration force resistance wherein a first flat member is formed of ceramic and a second mating flat member is formed of a compliant material or ceramic with the circuit components affixed to the ceramic material, by welding, deposition, or the like, and the two members laminated together so that the ceramic member provides the required rigidity for the package. Windows may be formed in the compliant member so that components on the ceramic member may be laser trimmed to tune the stripline circuit. In this fashion, a stripline circuit package is formed with sufficient rigidity to withstand high G acceleration forces, components may be welded and/or deposited on the ceramic so that sufficiently good bonds are provided between electrical components and the ceramic, and the package may be laser trimmed after lamination to accurately tune the circuit.

It is an object of the present invention to provide a new and improved stripline circuit utilizing at least one ceramic member in the package to provide the required high dielectric constant material and high G force resistance.

It is a further object of the present invention to provide a new and improved package for a stripline circuit utilizing welding, deposition and laser trimming techniques to obtain required operating characteristics.

These and other objects of this invention will become apparent to those skilled in the art upon consideration of the accompanying specification, claims and drawing.

BRIEF DESCRIPTION OF THE DRAWING

The single FIGURE is an exploded view in perspective of a stripline circuit packaged in accordance with the present invention.

DESCRIPTION OF THE PREFERRED EMBODIMENT

Referring to the single FIGURE, the numeral 10 generally designates a stripline package formed in accordance with the present invention. The package 10 includes a first member 11 and a second member 12. The member 11 is formed with an inner surface 15 and an outer surface (not shown). The member 12 is formed with an inner surface (not shown) and an outer surface 18. The thickness of the members 11 and 12 is a predetermined thickness which will provide the stripline circuit with the desired electrical characteristics when the package is complete. In the present embodiment the member 11 is formed of a ceramic material, such as alumina or the like having a relatively high dielectric constant, generally ten or above. The member 12 is formed of a ceramic or a high dielectric constant compliant material which permits ease of lamination, such as a ceramic impregnated teflon (sold under the trademark Epsilam 10, by 3M, Inc.). The material making up the member 12 has substantially the same dielectric constant as the ceramic making up the member 11 so that the dielectric constant characteristics of both members 11 and 12 are similar.

The inner surface 15 of the member 11 has electrical components fixedly positioned thereon by any of a variety of procedures. For example, a component 20 is affixed to the inner surface 15 of the member 11 by welding, a component 21 is deposited on the inner surface 15, and other bonding techniques may be utilized if desired. A copper layer 25 is affixed to the outer surface of the member 11 by some convenient means, such as bonding, deposition, or the like and a copper layer 26 is affixed to the outer surface 18 of the member 12 by bonding or the like to form ground planes for the finished stripline circuit. Because the ceramic making up the member 11 has a high resistance to heat, components can be attached thereto by welding and/or depositing material thereon in any of the well known techniques. Further, microwave integrated circuits can be fixedly attached thereto without danger of the circuits breaking loose under high G stresses.

When the circuit components have been properly positioned and affixed to the member 11, the member 12 is laminated thereto by some convenient means, such as the positioning of a film of adhesive 30 therebetween, pressing the members 11 and 12 together with the film 30 therebetween and processing the package with heat or the like to provide the required bonding. The ceramic member 11 provides the package with sufficient rigidity to prevent deforming under high G forces and further provides the package with an improved resistance to high temperatures. If additional mechanical strength or rigidity is required or if the package may be subjected to relatively high temperatures, both members 11 and 12 can be formed of ceramic. However, if both members 11 and 12 are formed of ceramic there may be some additional care required in forming the inner surfaces so that a tight lamination is possible.

A window 35 is formed in the member 12 (and also in the film 30, if required) to allow laser trimming of components affixed to the inner surface of the member 11 after the package is laminated or bonded together. While a single window is illustrated it should be understood that more may be included if addditional components require trimming. Laser trimming of the components is possible because the member 11 is formed of ceramic which will withstand the high heat of the laser during trimming. Because the package can be laser trimmed or tuned after lamination thereof, the tuning is extremely accurate and simple. Further, because welding, deposition and laser trimming can be utilized in the package 10 the cost of the stripline circuit is substantially reduced and manufacturing methods and time are substantially improved.

While I have shown and described a specific embodiment of this invention, further modifications and improvements will occur to those skilled in the art. I desire it to be understood, therefore, that this invention is not limited to the particular form shown and I intend in the appended claims to cover all modifications which do not depart from the spirit and scope of this invention.

What is claimed is:

1. In a stripline circuit requiring a relatively high dielectric constant material and a high G force acceleration resistance, an improved package comprising:
   (a) a first flat member formed of ceramic and having a predetermined relatively uniform thickness with an inner surface having circuit components positioned thereon and an outer surface having a layer of electrical conducting material thereover;
   (b) a second flat member formed of a compliant material having a predetermined relatively uniform thickness and formed to mate with said first member and to be coextensive with at least the portion having circuit components thereon, said second flat member having an outer surface with a layer of electrical conductivity material thereover and an inner surface; and
   (c) means laminating the inner surface of said first member to the inner surface of said second member so that the circuit components form a stripline circuit and the layers of electrical conducting material form a ground plane on either side thereof.

2. An improved package as claimed in claim 1 wherein the second flat member is formed of a ceramic impregnated teflon material having substantially the same dielectric constant as the ceramic forming the first member.

3. An improved package as claimed in claim 1 wherein the ceramic forming the first member is substantially comprised of alumina.

4. An improved package as claimed in claim 1 wherein the ceramic forming the first member and the material forming the second member both have similar dielectric properties and the dielectric constant is in the range of approximately 10 and above.

5. An improved package as claimed in claim 1 wherein the second member is constructed to define at least one window therein for laser trimming circuit components therethrough.

6. An improved package as claimed in claim 1 wherein the circuit components include at least one passive electrical device deposited on the first member.

7. An improved package as claimed in claim 1 wherein the circuit components include at least one component welded to the ceramic.

8. An improved package as claimed in claim 1 wherein the electrical conductivity material forming the layers over the outer surfaces of the first and second members is copper.

9. In a stripline circuit requiring a relatively high dielectric constant material and a high G force resistance, an improved method of producing a package comprising the steps of:
   (a) forming a first flat member of ceramic with a predetermined relatively uniform thickness defining an inner and outer surface;
   (b) fixedly positioning circuit components on the inner surface of said first member;
   (c) forming a second flat member of a compliant material with a predetermined relatively uniform thickness and inner and outer surfaces and formed to mate with said first member and to be coextensive with at least the portion having circuit components thereon;
   (d) fixedly attaching layers of electrical conducting material to the outer surface of said first and second members to form stripline ground planes; and
   (e) laminating the inner surface of said first member to the inner surface of said second member to form a stripline circuit.

10. An improved method of producing a package as claimed in claim 9 wherein the step of fixedly positioning circuit components on the inner surface of said first member includes welding at least one component to the ceramic.

11. An improved method of producing a package as claimed in claim 9 including the steps of providing at least one window through the second member for providing external access to at least one circuit component and adjusting said one circuit component after laminating the first and second members to adjust the operation of the stripline circuit.

12. An improved method of producing a package as claimed in claim 11 wherein the at least one component is adjusted by laser trimming.

* * * * *